(12) United States Patent
Yano et al.

(10) Patent No.: US 7,071,523 B2
(45) Date of Patent: Jul. 4, 2006

(54) ENCAPSULATED LIGHT RECEIVING AND PROCESSING SEMICONDUCTOR MODULE WITH ENHANCED SHIELDING AND GROUNDING PROPERTIES

(75) Inventors: Shinji Yano, Kyoto (JP); Naoki Kumura, Kyoto (JP); Tetsuya Yamasaki, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/901,006

(22) Filed: Jul. 27, 2004

(65) Prior Publication Data

US 2005/0073018 A1    Apr. 7, 2005

(30) Foreign Application Priority Data

Jul. 28, 2003  (JP)  ............................. 2003-281303
Sep. 2, 2003   (JP)  ............................. 2003-310024

(51) Int. Cl.
*H01L 31/0203*  (2006.01)
*H01L 31/0216*  (2006.01)
*H01L 31/0224*  (2006.01)
*H01L 31/0232*  (2006.01)

(52) U.S. Cl. ...................... 257/433; 257/431; 257/432; 257/434; 257/666; 257/690; 257/701; 257/723; 257/724; 257/787

(58) Field of Classification Search ................. 257/433
See application file for complete search history.

(56) References Cited

U.S. PATENT DOCUMENTS

| | | | | |
|---|---|---|---|---|
| 5,291,054 A | * | 3/1994 | Tanaka et al. | 257/433 |
| 6,407,381 B1 | * | 6/2002 | Glenn et al. | 250/239 |
| 6,459,130 B1 | * | 10/2002 | Arndt et al. | 257/432 |
| 6,855,886 B1 | * | 2/2005 | Kawamura et al. | 174/52.2 |

FOREIGN PATENT DOCUMENTS

| | | |
|---|---|---|
| JP | 7-273356 | 10/1995 |
| JP | 07-273356 | * 10/1995 |

* cited by examiner

*Primary Examiner*—Eddie Lee
*Assistant Examiner*—Andrew O. Arena
(74) *Attorney, Agent, or Firm*—Hamre, Schumann, Mueller & Larson, P.C.

(57) ABSTRACT

A semiconductor module that includes a resin package having a first surface and a second surface which is different from the first surface. A lead includes an inner portion covered by the resin package and an outer portion projecting from the first surface of the resin package. A semiconductor element is mounted to the inner portion of the lead and is covered by the resin package. A conductive film, provided separately from the lead, covers at least the second surface of the resin package, with the conductive film provided with a connecting portion held in contact with the outer portion of the lead at the first surface of the resin package. The inner portion of the lead includes an extension extending toward the second surface of the resin package the extension being held in contact with the conductive film at the second surface of the resin package.

12 Claims, 11 Drawing Sheets

ENCAPSULATED LIGHT RECEIVING AND PROCESSING SEMICONDUCTOR MODULE WITH ENHANCED SHIELDING AND GROUNDING PROPERTIES

BACKGROUND OF THE INVENTION

1. Field of the Invention

The present invention generally relates to a semiconductor module to be incorporated in electrical appliances. The present invention particularly relates to a light receiving module to be used for an infrared remote control system.

2. Description of the Related Art

Recently, various electrical appliances such as a television receiver or an air conditioner can be controlled by a wireless remote controller. Such a remote controller utilizes e.g. infrared rays as the control signals. The infrared signals emitted from the controller are detected by a light receiving module incorporated in the electrical appliance.

Figure 13:
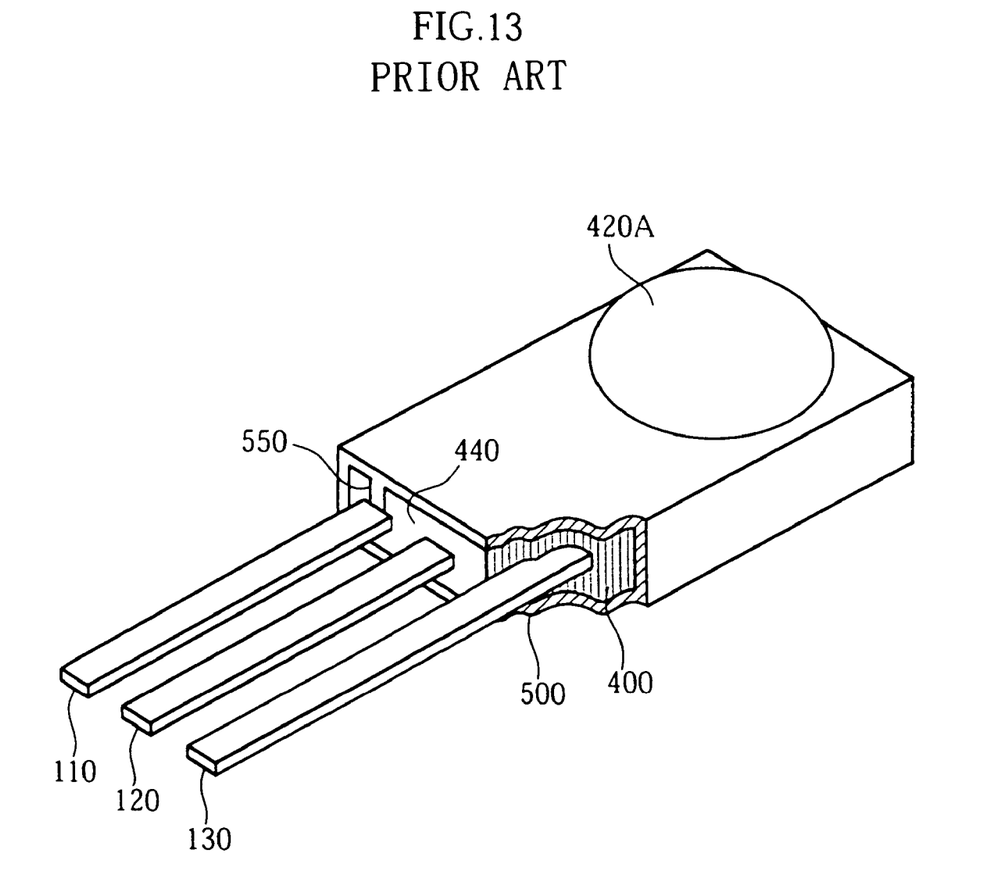
FIG. 13 is a perspective view showing a prior art light receiving module.

JP-A-7-273356 discloses an example of prior art light receiving module. As shown in FIG. 13 of the present application, the prior art light receiving module includes a grounding terminal 110, two terminals 120 and 130, a light receiving element (not shown), and a resin package 400 sealing the light receiving element. Each of the terminals 110, 120 and 130 projects from a base end surface 440 of the package 400 and is connected to the light receiving element within the package 400.

The light receiving element is so structured as to detect infrared signals with high sensitivity and is susceptible to the influence of noises such as electromagnetic waves. Therefore, a conductive film 500 as an electromagnetic shield is formed on the package 400. The conductive film 500 is connected to the grounding terminal 110 via a connection strip 550 provided on the base end surface 440 of the package 400.

When the connection between the connection strip 550 and the grounding terminal 110 is cut, the conductive film 500 becomes an ungrounded state and hence cannot serve as an electromagnetic shield. With the structure of the prior art light receiving module, such an ungrounded state of the conductive film 500 is likely to occur. Specifically, as shown in FIG. 13, the connection strip 550 is connected only to the upper surface portion of the grounding terminal 110. With such a connection arrangement, when the grounding terminal 110 is bent downward from the root portion due to the action of an external force, the connection strip 550 may be easily separated from the grounding terminal 110.

SUMMARY OF THE INVENTION

The present invention has been conceived under the circumstances described above. It is, therefore, an object of the present invention to provide a semiconductor module having stable electromagnetic shielding effect.

According to a first aspect of the present invention, there is provided a semiconductor module comprising a resin package including a first surface and a second surface which is different from the first surface, a lead including an inner portion covered by the resin package and an outer portion projecting from the first surface of the resin package, a semiconductor element mounted to the inner portion of the lead and covered by the resin package, and a conductive film covering at least the second surface of the resin package. The inner portion of the lead includes an extension extending toward the second surface of the resin package, and the extension is held in contact with the conductive film.

Preferably, the extension projects from the second surface of the resin package.

Preferably, the semiconductor element comprises a light receiving element having a light receiving surface, and the light receiving surface is formed with a mesh-like conductor pattern.

Preferably, the resin package includes a lens surface for converging light onto the light receiving element, and the conductive film has light shielding property.

Preferably, the semiconductor module according to the first aspect of the present invention further comprises a connection strip provided on the first surface of the resin package and connected to the conductive film. The connection strip is held in contact with the lead while surrounding the lead.

According to a second aspect of the present invention, there is provided a semiconductor module comprising a resin package, a conductor including an inner portion covered by the resin package and an outer portion projecting from the resin package, and a semiconductor element mounted to the inner portion of the lead and covered by the resin package. The inner portion of the conductor is formed with a recess for accommodating the semiconductor element. The recess is defined by a bottom portion to which the semiconductor element is mounted, and a sidewall surrounding the semiconductor element. The sidewall is tapered toward the bottom portion.

Preferably, the recess has a depth which is no smaller than the thickness of the semiconductor element.

Preferably, the bottom portion and the side wall of the recess have substantially the same thickness.

Preferably, the semiconductor element comprises a light receiving element, and the side wall of the recess includes a reflective surface for reflecting light toward the light receiving element.

The semiconductor module according to the second aspect of the present invention further comprises an integrated circuit element for processing a signal outputted from the light receiving element, and a resin material covering the integrated circuit element. The resin material is covered by the resin package and has light shielding property which is higher than the light shielding property of the resin package.

According to a third aspect of the present invention, there is provided a semiconductor module comprising a resin package including a first surface and a second surface which is different from the first surface, a lead including an inner portion covered by the resin package and an outer portion projecting from the first surface of the resin package, a semiconductor element mounted to the inner portion of the lead and covered by the resin package, and a conductive film covering at least the second surface of the resin package. The inner portion of the lead includes an extension extending toward the second surface of the resin package, and the extension is held in contact with the conductive film. The inner portion of the lead is formed with a recess for accommodating the semiconductor element.

Preferably, the extension projects from the second surface of the resin package.

Preferably, the semiconductor module according to the third aspect of the present invention further comprises a connection strip provided on the first surface of the resin package and connected to the conductive film. The connection strip is held in contact with the lead while surrounding the lead.

Preferably, the recess has a depth which is no smaller than the thickness of the semiconductor element.

Preferably, the recess is defined by a bottom portion to which the semiconductor element is mounted and a side wall surrounding the semiconductor element. The side wall is tapered toward the bottom portion.

Preferably, the side wall of the recess includes a reflective surface for reflecting light toward the semiconductor element.

Preferably, the semiconductor module according to the third aspect of the present invention further comprises an integrated circuit element for processing a signal outputted from the semiconductor element, and a resin material covering the integrated circuit element. The resin material is covered by the resin package and has light shielding property which is higher than that of the resin package.

Other features and advantages of the present invention will become clearer from the description given below with reference to the accompanying drawings.

DETAILED DESCRIPTION OF THE PREFERRED EMBODIMENTS

Preferred embodiments of the present invention will be described below with reference to the accompanying drawings. In the embodiments and variations given below, the elements which are identical or similar to each other are designated by the same reference signs.

Figure 1:
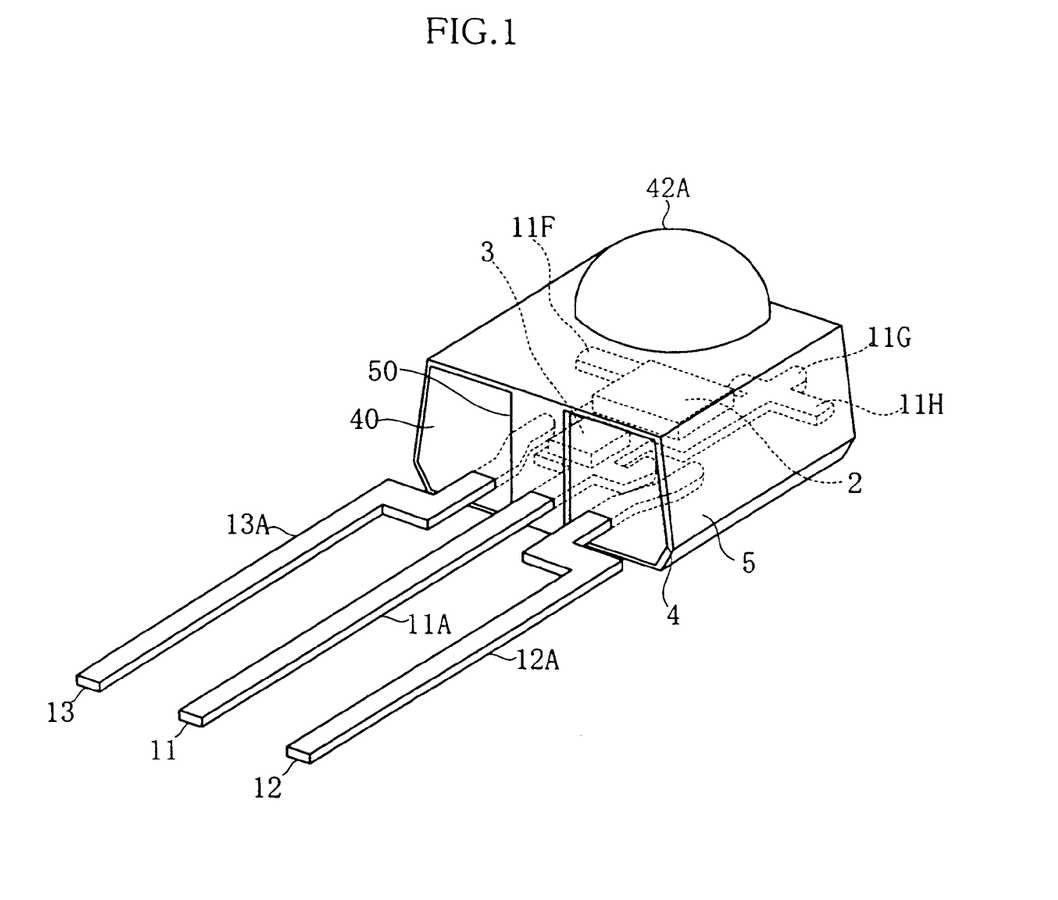
FIG. 1 is a perspective view showing a light receiving module according to a first embodiment of the present invention.

FIGS. 1–4 illustrate a light receiving module according to a first embodiment of the present invention. The light receiving module is incorporated in e.g. audiovisual equipment (such as television receiver, video recorder, CD player) for receiving control signals transmitted from an infrared remote controller. As shown in FIG. 1, the light receiving module includes a light receiving element 2, an integrated circuit element 3, and a first through a third leads 11–13.

Although the light receiving element 2 comprises a photodiode in this embodiment, the present invention is not limited thereto. For example, a phototransistor may be used instead of the photodiode.

The photodiode 2 and the integrated circuit element 3 are entirely covered by a resin package 4. Each of the leads 11–13 is partially covered by the package 4. As a result, the leads include inner portions covered by the package 4 and outer portions 11A–13A projecting from a base end surface 40 of the package 4, respectively. The outer portions 11A–13A serve as connection terminals. On the resin package 4 is formed a conductive film 5.

The first through the third leads 11–13 are made of a metal such as iron or copper, for example. The first lead 11 is for grounding. The second lead 12 is utilized for supplying power source voltage. The third lead 13 is utilized for outputting signals. As will be understood from FIG. 1, the first through the third leads 11–13 extend within the same plane. The leads 11–13 originate from a lead frame used for manufacturing the light receiving module. Though not illustrated, the lead frame includes a main support body and a plurality of lead forming portions integrally connected to the main support body. The leads 11–13 are obtained by separating appropriate lead forming portions from the main support body in a process step for manufacturing the light receiving module.

Figure 2:
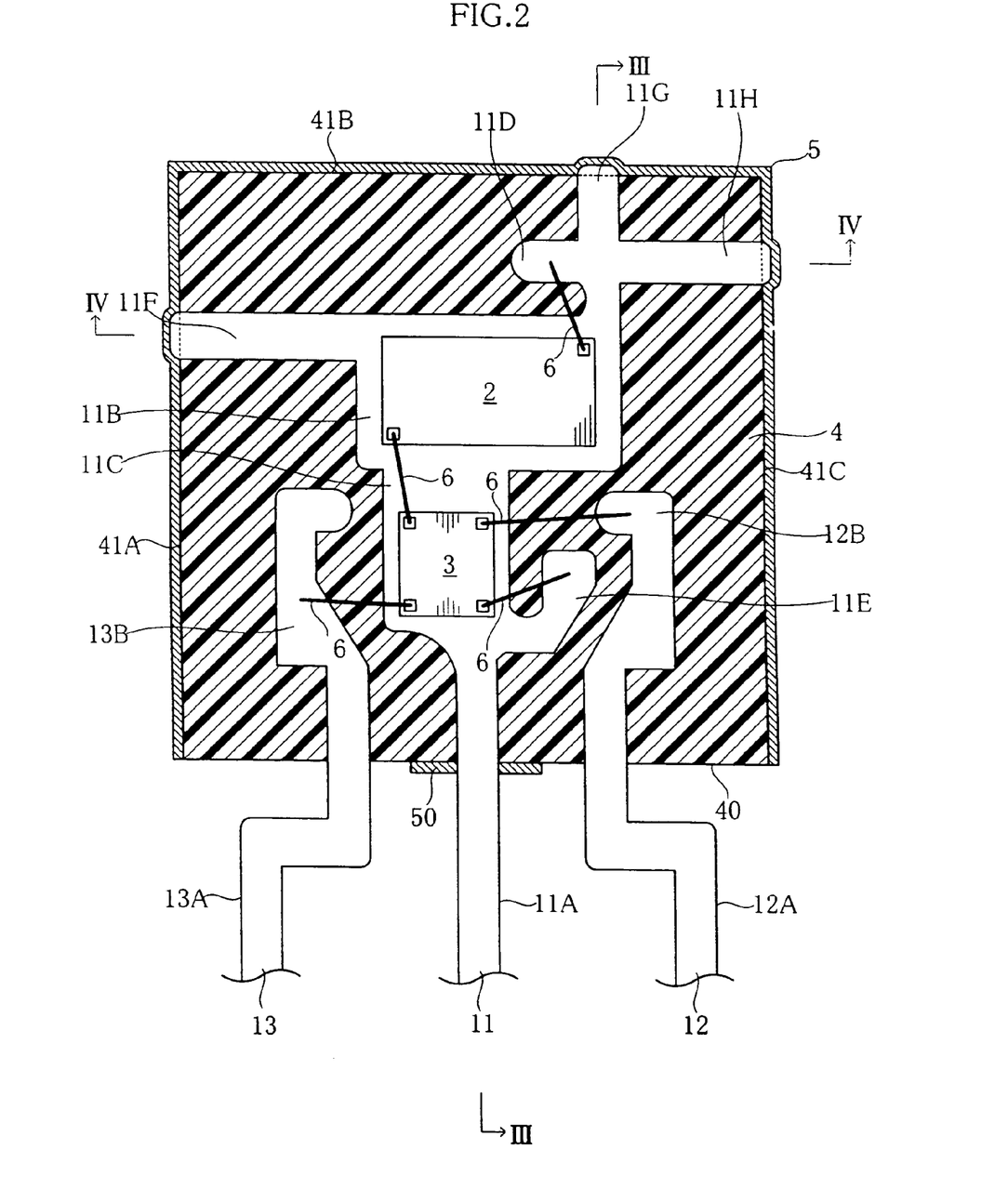
FIG. 2 is a plan view showing the electrical connection arrangement in the light receiving module.
Figure 3:
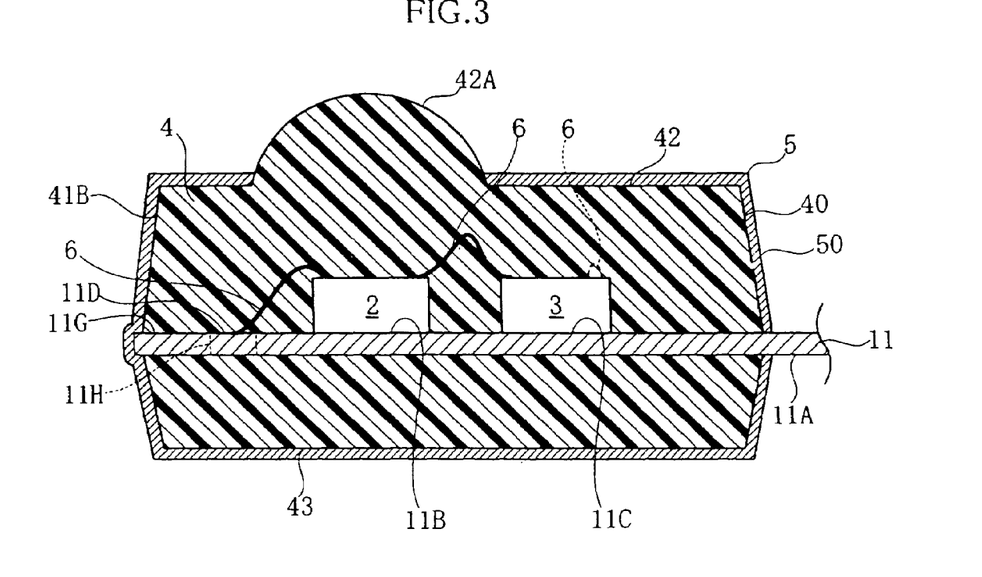
FIG. 3 is a sectional view taken along lines III—III in FIG. 2.
Figure 4:
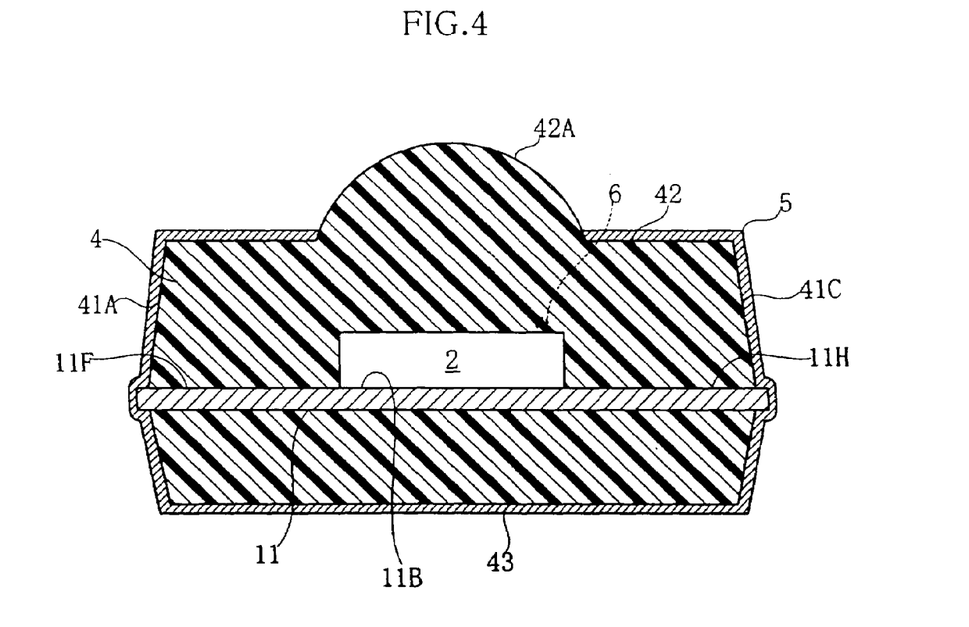
FIG. 4 is a sectional view taken along lines IV—IV in FIG. 2.

As shown in FIG. 2, the photodiode 2 and the integrated circuit element 3 are mounted to the inner portion of the first lead 11. Specifically, the photodiode 2 is mounted to a die bonding portion 11B, whereas the integrated circuit element 3 is mounted to a die bonding portion 11C. The inner portion of the first lead 11 further includes wire bonding portions 11D and 11E. The wire bonding portion 11D is connected to the photodiode 2 via a wire 6. The wire bonding portion 11E is connected to the integrated circuit element 3 via another wire 6.

The inner portion of the first lead 11 further includes a plurality of extensions 11F–11H for grounding. In FIG. 2, the extension 11F extends from the die bonding portion 11B to the left and projects from a side surface 41A of the resin package 4 for coming into contact with the conductive film 5. The extension 11G extends upward from the die bonding portion 11B (or the wire bonding portion 11D) and projects from a side surface 41B of the resin package 4 for coming into contact with the conductive film 5. The extension 11H extends from the wire bonding portion 11D to the right and projects from a side surface 41C of the resin package 4 for coming into contact with the conductive film 5. The extension 11G extends parallel to the outer portion 11A of the first lead, whereas the extensions 11F and 11H extend non-parallel to (perpendicularly to) the outer portion 11A.

In order for each extension 11F–11H to come into contact with the conductive film 5, the extension need not necessarily project from a side surface of the package 4. For example, the front end of the extension may be flush with the side surface of the package 4.

As shown in FIG. 2, the second and the third lead terminals 12 and 13 are arranged to flank the first lead 11. The inner portion 12B of the second lead 12, which is connected to the outer portion 12A, is connected to the integrated circuit element 3 via a wire 6. Similarly, the inner portion 13B of the third lead 13, which is connected to the outer portion 13A, is connected to the integrated circuit element 3 via another wire 6.

Upon receiving an infrared signal sent from a remote controller, the photodiode 2 outputs a signal current corresponding to the infrared signal. For this purpose, the photodiode 2 has a PN junction structure comprising an upper layer made of P type semiconductor and a lower layer made of N type semiconductor. Connection pads for respective layers are provided on the upper surface of the photodiode 2. The pad for the N type semiconductor layer is connected to the integrated circuit element 3 via the wire 6. The pad for the P type semiconductor layer is connected to the wire bonding portion 11D via another wire 6. Between the photodiode 2 and the first lead 11 is provided an insulating material (not shown) for providing insulation between the N type semiconductor layer (lower layer) and the first lead 11.

The integrated circuit element 3 appropriately processes the signal current outputted from the photodiode 2 and outputs the processed signal to an external controlling device. To perform this processing, the integrated circuit element 3 includes a current/voltage conversion circuit, an amplification circuit, a limit circuit, and a detection circuit, for example. The integrated circuit element 3 is bonded to the first lead 11 via a connection layer (not shown) made of silver paste, for example.

The resin package 4, which is mainly composed of an epoxy resin, is visible-light-impermeable but infrared-permeable. The package 4 has an upper surface 42 formed with a convex lens surface 42A. Infrared rays traveling from the infrared controller are converged onto the photodiode 2 by the lens surface 42A.

For example, the photoconductive film 5 is made of a conductive resin material prepared by adding carbon or other conductive filler to an epoxy resin. Preferably, the photoconductive film has light shielding property to prevent disturbing external light from entering the package 4. The conductive film 5 is formed on the package 4 so as not to cover the base end surface 40 and the lens surface 42A of the package 4.

According to the present invention, to enhance the electromagnetic shielding effect, the lens surface 42A may be partially covered by a conductive member. In this case, for example, a mesh-like conductor pattern connected to the conductive film 5 is formed on the lens surface 42A.

The base end surface 40 of the resin package 4 is formed with a conductive connection strip 50 for connecting the grounding terminal 11A and the conductive film 5 to each other. The connection strip 50 is held in contact with the grounding terminal 11A while surrounding the root portion of the terminal. Specifically, the strip 50 is held in contact with the upper surface, lower surface and two side surfaces of the root portion. The strip 50 extends across the base end surface 40 of the package and has an upper edge connected to a portion of the conductive film 5 (the portion formed on the upper surface 42 of the package) and a lower edge connected to another portion of the conductive film 5 (the portion formed on the lower surface 43 of the package).

Since the method for manufacturing the above-described light receiving module is basically similar to the method for manufacturing the prior art light receiving module (FIG. 13), detailed description thereof is omitted.

Although the conductive film 5 can be made of the above-described conductive resin material, the present invention is not limited thereto. For example, the conductive film 5 may be made of a metal instead of the conductive resin material. In this case, a metal layer for covering the entire surface of the package 4 is formed by sputtering or electroless plating, for example. Thereafter, unnecessary portions are removed by etching, for example, to provide a desired conductive film 5. Alternatively, sputtering may be performed with masking applied to predetermined portions of the package 4.

In the state before the formation of the conductive film 5, respective front ends of the extensions 11F–11H of the first lead 11 project from the surfaces of the package 4. Therefore, by forming the conductive film 5 on the package 4, electrical connection can be easily established between the first lead 11 and the conductive film 5.

The above-described light receiving module has the following advantages. As noted before with reference to FIG. 1, the connection strip 50 is held in contact with the four surfaces (upper surface, lower surface and opposite side surfaces) of the grounding terminal 11A. Therefore, as compared with the prior art light receiving module shown in FIG. 13 (in which the connection strip 550 contacts only the upper surface of the terminal 110), the electrical disconnection between the connection strip 50 and the grounding terminal 11A is more reliably prevented. Additionally, the grounding terminal 11A is connected to the conductive film 5 via the extensions 11F–11H. Therefore, even when the connection strip 50 and the grounding terminal 11A are disconnected from each other, electrical conduction between the grounding terminal 11A and the conductive film 5 are maintained.

Figure 5:
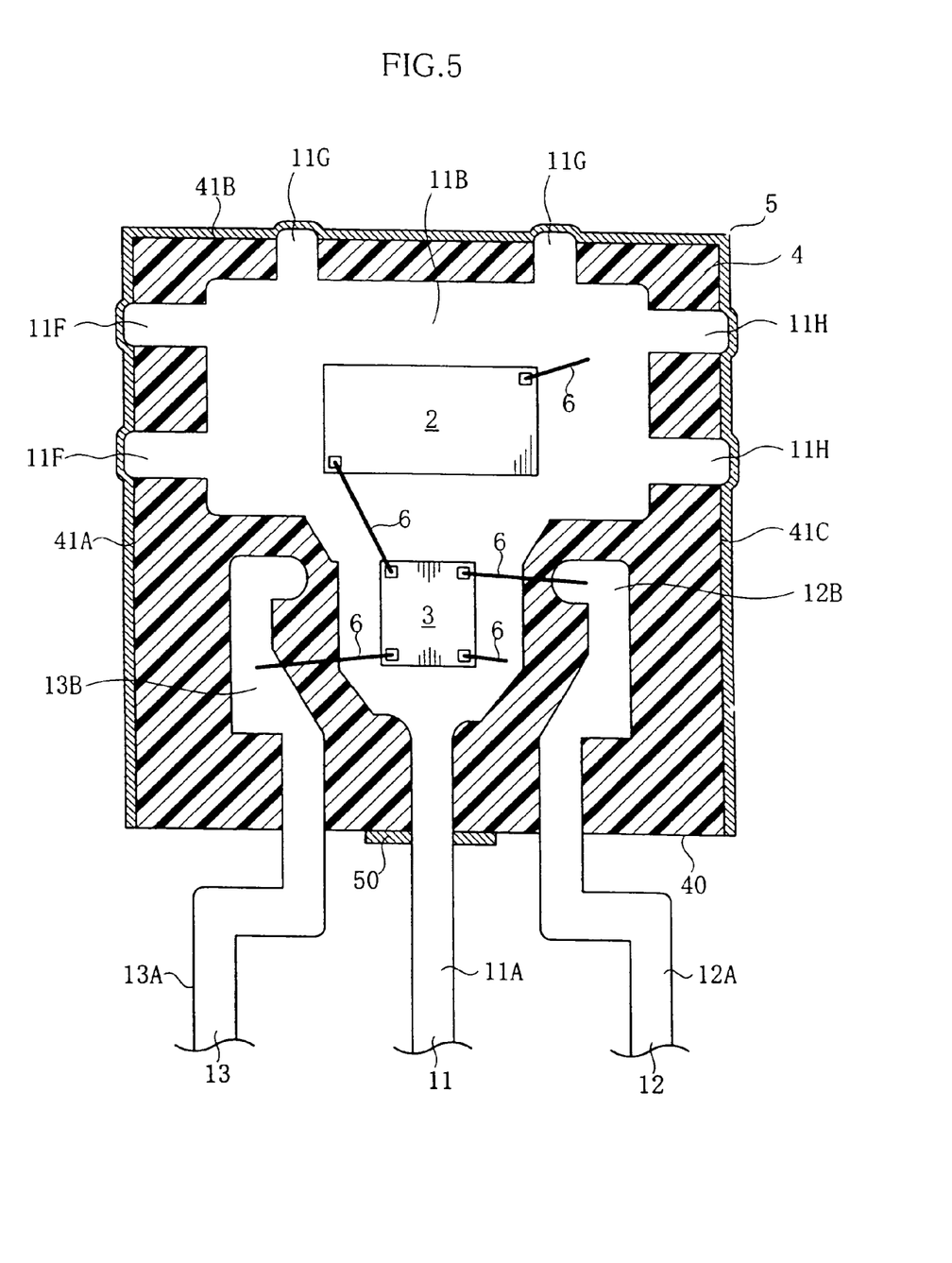
FIG. 5 is a plan view showing the electrical connection arrangement in a variation of the light receiving module.
Figure 6:
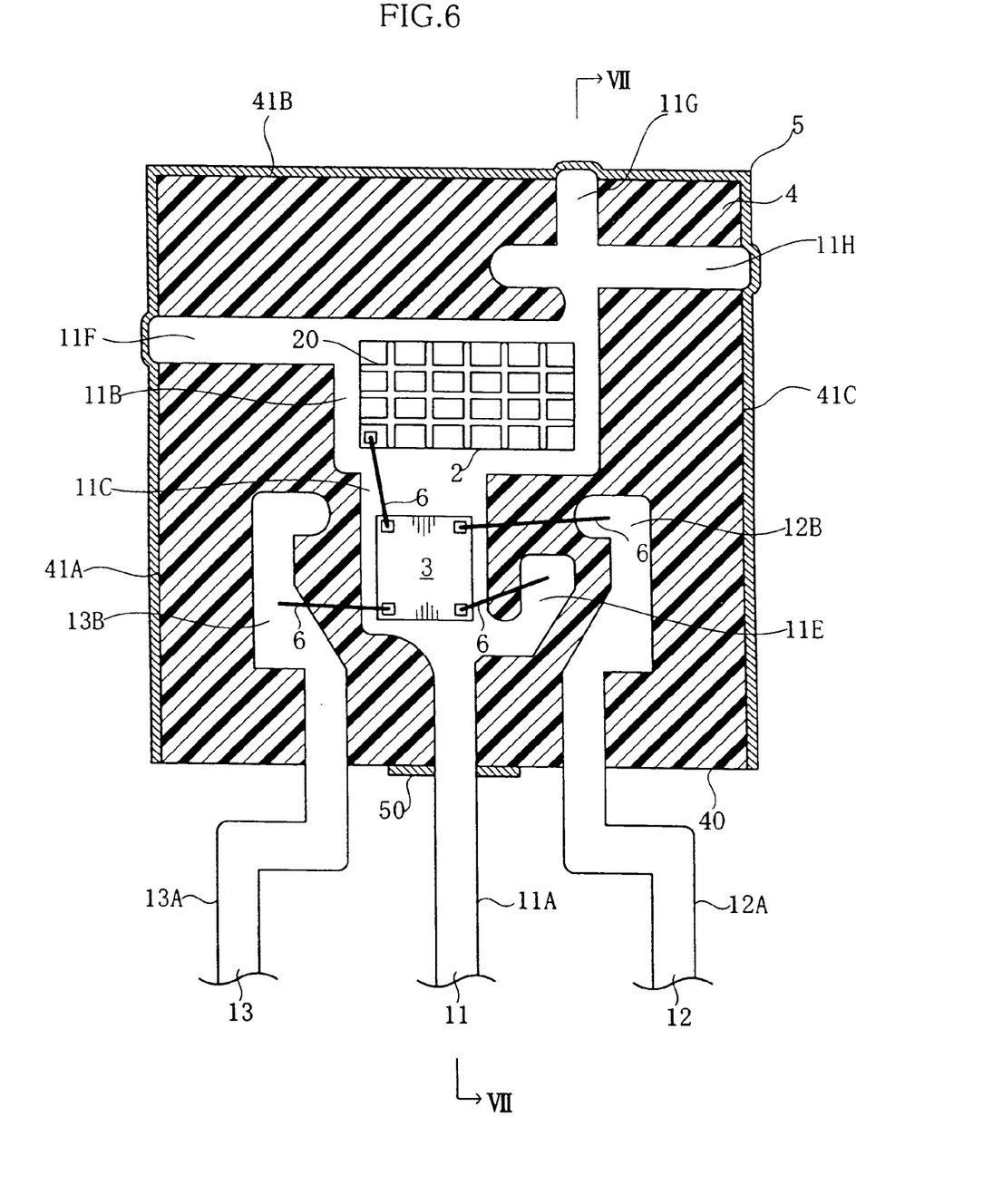
FIG. 6 is a plan view showing the electrical connection arrangement in another variation of the light receiving module.

FIGS. 5 and 6 show variations of the above-described light receiving module.

The inner portion of the first lead 11 shown in FIG. 5 includes a first through a third pairs of extensions extending from the die bonding portion 11B. The first pair of extensions 11F project from the left side surface 41A of the package 4 for coming into contact with the conductive film 5. The second pair of extensions 11G project from the upper side surface 41B of the package 4 for coming into contact with the conductive film 5. The third pair of extensions 11H project from the right side surface 41C of the package 4 for coming into contact with the conductive film 5. In this way, by bringing six extensions into contact with the conductive film 5, the noise cancellation effect can be further improved as compared with the structure shown in FIG. 2.

Figure 7:
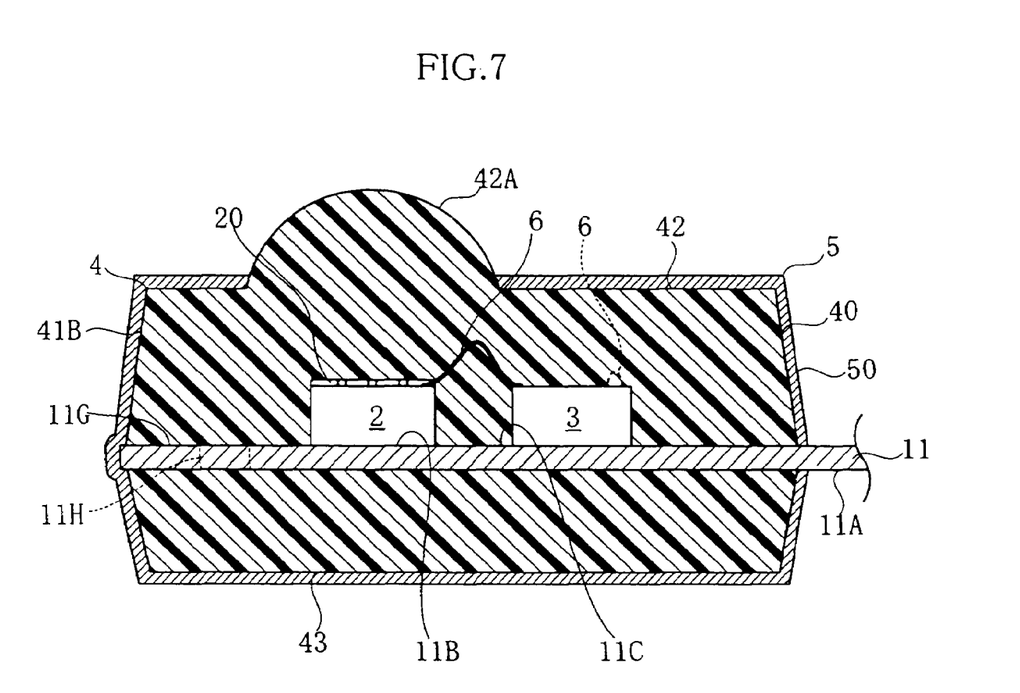
FIG. 7 is a sectional view taken along lines VII—VII in FIG. 6.
Figure 8:
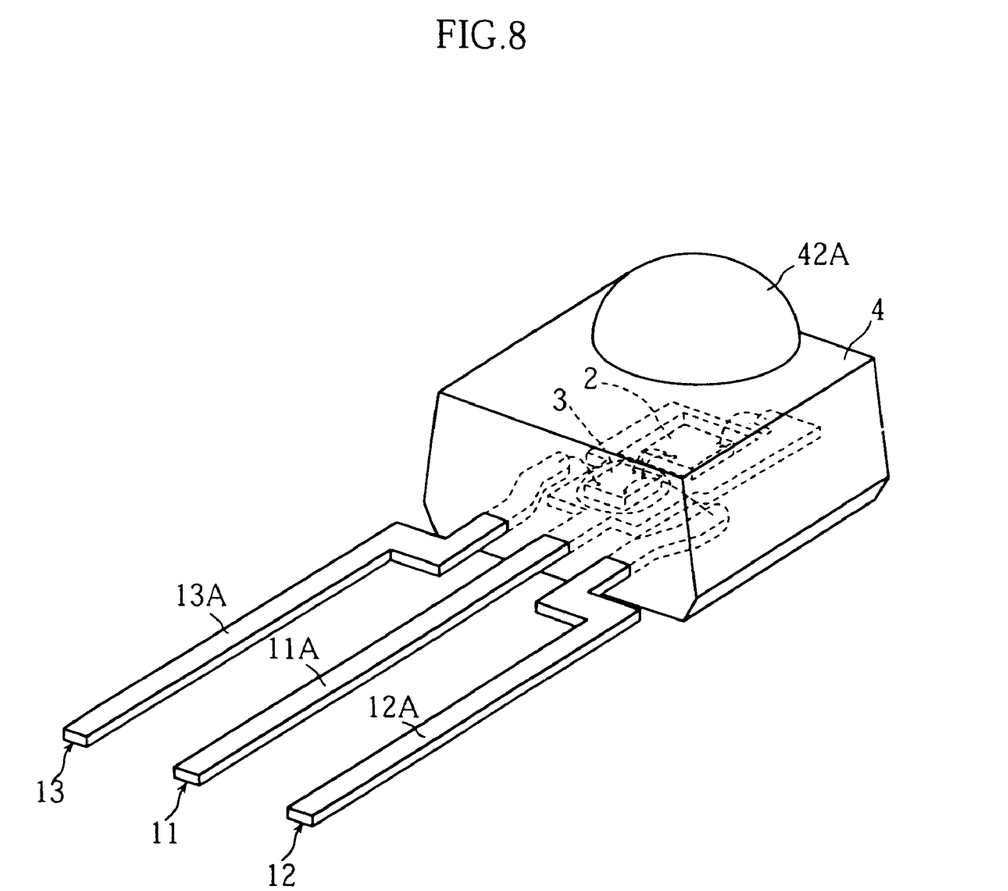
FIG. 8 is a perspective view showing a light receiving module according to a second embodiment of the present invention.

In the light receiving module shown in FIG. 6, the structure of the photodiode 2 is upside down relative to that of the photodiode shown in FIG. 2. Specifically, the photodiode 2 of FIG. 6 has a PN junction structure comprising a P type semiconductor layer as the lower layer and an N type semiconductor layer as the upper layer. The P type semiconductor layer (lower layer) is connected to the die bonding portion 11B of the first lead 11 via a conductive paste layer (not shown), for example. The N type semiconductor layer (upper layer) is connected to the integrated circuit element 3 via a wire 6 (See also FIG. 7). The upper surface (light receiving surface) of the photodiode 2 is formed with a mesh-like conductor pattern 20. The conductor pattern 20 may be made by a semiconductor manufacturing process by using aluminum as the material. The conductor pattern 20 is insulated from the upper layer, i.e. the N type semiconductor layer by a passivation film (not shown) while being connected (ground connection) to the lower layer, i.e. the P type semiconductor layer. With such a structure, the conductor pattern 20 can block the electromagnetic noises entering through the lens surface 42A.

FIGS. 8–11 show a light receiving module according to a second embodiment of the present invention. Similarly to the module of the first embodiment, the module of the second embodiment includes a photodiode 2, an integrated circuit element 3 and a first through a third leads 11–13. The photodiode 2 and the integrated circuit element 3 are entirely covered by a resin package 4. Each of the leads 11–13 is partially covered by the package 4. Thus, the leads include outer portions (connection terminals) 11A–13A projecting from the package 4, respectively. The upper surface of the package 4 is formed with a convex lens surface 42A.

In the first embodiment described above, a conductive film (electromagnetic shield) is provided on the resin package 4. In the second embodiment, however, such a conductive film is not provided.

Similarly to the first embodiment, the first through the third leads 11–13 originate from a lead frame. As will be described later, the first lead 11 includes a portion serving as a light emitting surface. For example, the light emitting surface may be formed by plating with a metal (such as tin) which has high light reflectance.

Figure 9:
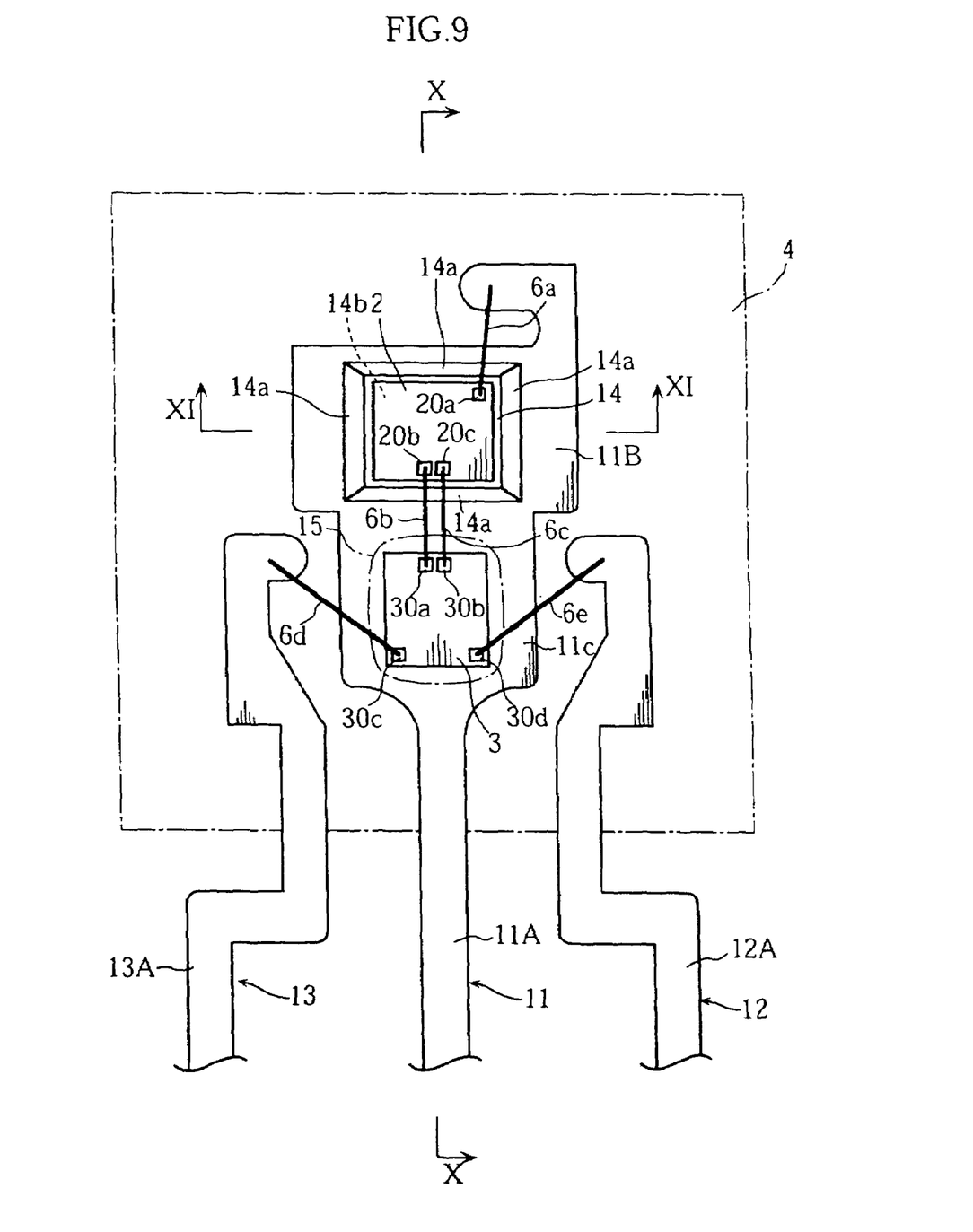
FIG. 9 is a plan view showing the electrical connection arrangement in the light receiving module according to the second embodiment.
Figure 10:
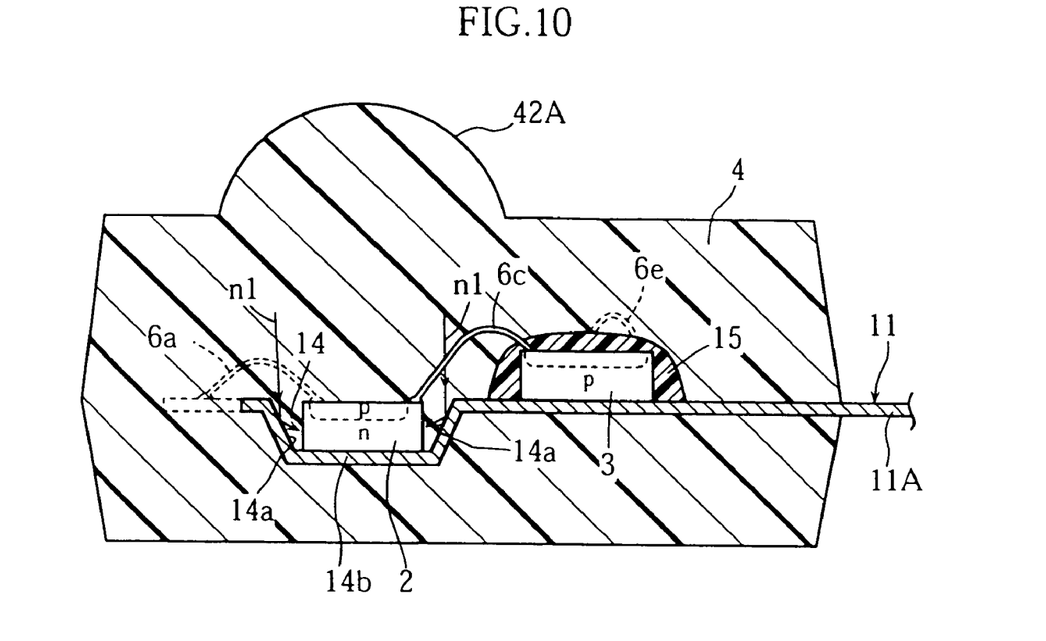
FIG. 10 is a sectional view taken along lines X—X in FIG. 9.
Figure 11:
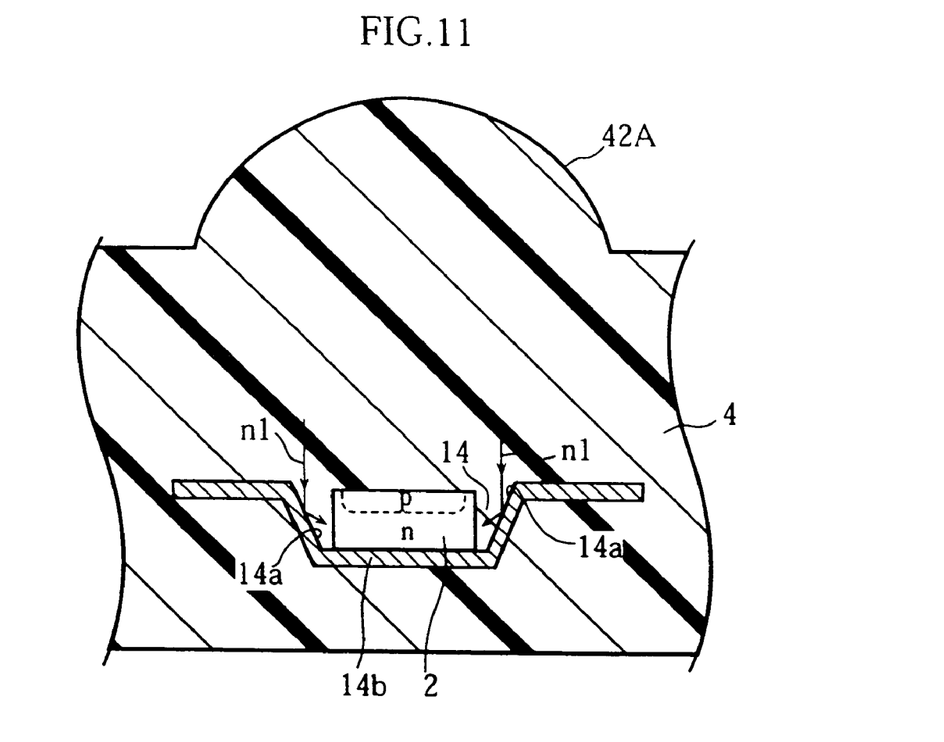
FIG. 11 is a sectional view taken along lines XI—XI in FIG. 9.

The first lead 11 includes die bonding portions 11B and 11C on which the photodiode 2 and the integrated circuit element 3 are mounted, respectively. The die bonding portion 11B is formed with a tapered recess 14 in which the photodiode 2 is accommodated. As shown in FIG. 9, the recess 14 is rectangular as viewed in plan. The recess 14 is defined by four side walls 14a and a bottom plate portion 14b connected to the side walls. As shown in FIGS. 10 and 11, each of the side walls 14a is inclined by a predetermined angle. The photodiode 2 has four rectangular side surfaces each of which faces a respective one of the four side walls 14a. The inner surface (directly facing the photodiode) of each side wall 14a is a reflective surface having high infrared reflectance. As shown in FIGS. 10 and 11, each of the reflective surfaces is non-parallel to the corresponding side surface of the photodiode 2 and inclined to come close to the photodiode 2 as it progresses downward from the upper edge thereof. As a result, the four reflective surfaces (four side walls 14a)as a whole form a truncated pyramid tapered downward. Preferably, the depth of the recess 14 is no smaller than the thickness of the photodiode 2 so that the photodiode can be entirely accommodated in the recess 14.

As will be easily understood, the resin package 4 is formed after the photodiode 2 is put in the recess 14 (and other necessary process is completed). Specifically, for example, the package 4 may be formed by supplying a resin material in a fluid state into a cavity and then hardening the supplied material. Therefore, as shown in FIG. 10 or 11, part of the resin package 4 enters the recess 14 to surround the photodiode 2.

Although the illustrated recess 14 is rectangular as viewed in plan, the present invention is not limited thereto. For example, the recess 14 may be circular or oval as viewed in plan.

The recess 14 can be formed by subjecting a predetermined portion of the first lead 11 to press working. As a result of the press working, the thickness of the side walls 14a of the recess 14 tends to become smaller than that of the bottom plate portion 14b. However, the thickness difference between the side walls 14a and the bottom plate portion 14b is negligibly small as compared with the length of the first lead 11. In this point, the thickness of the side walls 14a and that of the bottom plate 14b are substantially the same.

The photodiode 2 has a lower layer (N type semiconductor layer) and an upper layer (P type semiconductor layer). The bottom portion of the photodiode 2 is fixed to the bottom plate portion 14b of the recess 14 via an insulating material (not shown). As shown in FIG. 9, the upper surface of the photodiode 2 is provided with an anode pad 20a electrically connected to the P type semiconductor layer. The pad 20a is connected to the first lead 11 via a wire 6a. The upper surface of the photodiode 2 is further provided with a pair of cathode pads 20b and 20c electrically connected to the N type semiconductor layer. Correspondingly to this, the upper surface of the integrated circuit element 3 is provided with a pair of connection pads 30a and 30b. The cathode pad 20b is connected to the connection pad 30a via a wire 6b, whereas the cathode pad 20c is connected to the connection pad 30b via a wire 6c.

Though not illustrated, the PN junction portion of the photodiode 2 is divided into two similar regions, i.e. a first region and a second region. The first region is connected to the cathode pad 20b, whereas the second region is connected to the cathode pad 20c. When the PN junction portion of the photodiode 2 (i.e., the first and the second regions) receives an infrared signal, an electrical signal is outputted to the connection pads 30a, 30b of the integrated circuit element 3 via the cathode pads 20b, 20c and the wires 6b, 6c. At this time, by the action of electromagnetic noises on the wires 6b and 6c, noises may be mixed into the electrical signal transmitted through the wires. Even in such a case, the integrated circuit element 3 performs current/voltage conversion of the noise mixed electrical signal and then computes the difference from the noises to eliminate the electromagnetic noises. As a result, an electrical signal containing less noises or free from noises can be obtained.

The integrated circuit element 3 appropriately processes the electrical signal current outputted from the photodiode 2 and outputs the processed signal to an external controlling device. For this purpose, the integrated circuit element 3 includes a current/voltage conversion circuit, a difference circuit for performing difference processing, an amplification circuit, a limit circuit, and a detection circuit, for example. These circuits are provided by a large number of NPN transistors and a wiring pattern formed on the P type semiconductor layer. The wiring pattern covers a wide area of the upper layer portion of the integrated circuit element 3. Therefore, the wiring pattern can block electromagnetic noises traveling from the outside toward the integrated circuit element 3.

The upper surface of the integrated circuit element 3 is formed with a power supply pad 30c and an output pad 30d in addition to the above-described connection pads 30a and 30b. The pads 30c and 30d are connected to the leads 13 and 12 via wires 6d and 6e, respectively. The P type semiconductor layer of the integrated circuit element 3 is bonded to the first lead 11 via silver paste, for example.

In the resin package 4, the integrated circuit element 3 is entirely sealed by a protective member 15 made of resin. Unlike the resin package 4, the protective member 15 has infrared shielding property. Further, the protective member 15 has visible light shielding property which is higher than that of the resin package 4. With such a structure, malfunction of the integrated circuit element 3 caused by infrared rays and visible rays can be prevented.

As noted above, according to the second embodiment, the photodiode 2 is accommodated in the recess 14 formed in the first lead 11. Such a structure provides the following technical advantages.

The first advantage is that the recess 14 serves as an electromagnetic shield for the photodiode 2. Specifically, as shown in FIGS. 10 and 11, the four side walls 14a of the recess 14 surrounds the photodiode 2. Therefore, by grounding the first lead 11, the side walls 14a function as an electromagnetic shield for shielding the photodiode from electromagnetic noises traveling toward the side surfaces of the photodiode 2. Similarly, the bottom plate portion 14b also serves as an electromagnetic shield for the photodiode 2. These electromagnetic shields (i.e., the sidewalls 14a and the bottom plate portion 14b) are provided within the package 4 and formed by subjecting a portion of the first lead 11 to press working.

The second advantage is that the inclined inner walls of the recess 14 serve as a collector of infrared signals. When infrared signals are transmitted from an external remote controller toward the light receiving module, the infrared signals pass through the lens surface 42A of the resin package 4 to travel toward the photodiode 2. Ideally, all the infrared signals converged by the lens surface 42A should impinge on the upper surface of the photodiode 2. However, since part of the infrared rays may progress obliquely relative to the front side of the light receiving module, the amount of infrared signals impinging on the upper surface of the photodiode 2 tend to become smaller than that in an ideal situation. In this embodiment, however, the infrared signals traveling while deviating from the upper surface of the photodiode 2 can be reflected by the inclined inner walls of the recess 14 to impinge on the side surfaces of the photodiode 2. For example, as shown in FIG. 10 or 11, the infrared signal n1 is reflected by the sidewall 14a and then impinges on a side surface of the photodiode 2. Generally, photodiodes, including the photodiode 2 of this embodiment, generate an electromotive force also by the light incident on the side surfaces. Therefore, due to the incidence of the infrared signal n1, an electromotive force is generated in the photodiode 2. In this way, the provision of the recess 14 enhances the signal detection sensitivity of the light receiving module.

Figure 12:
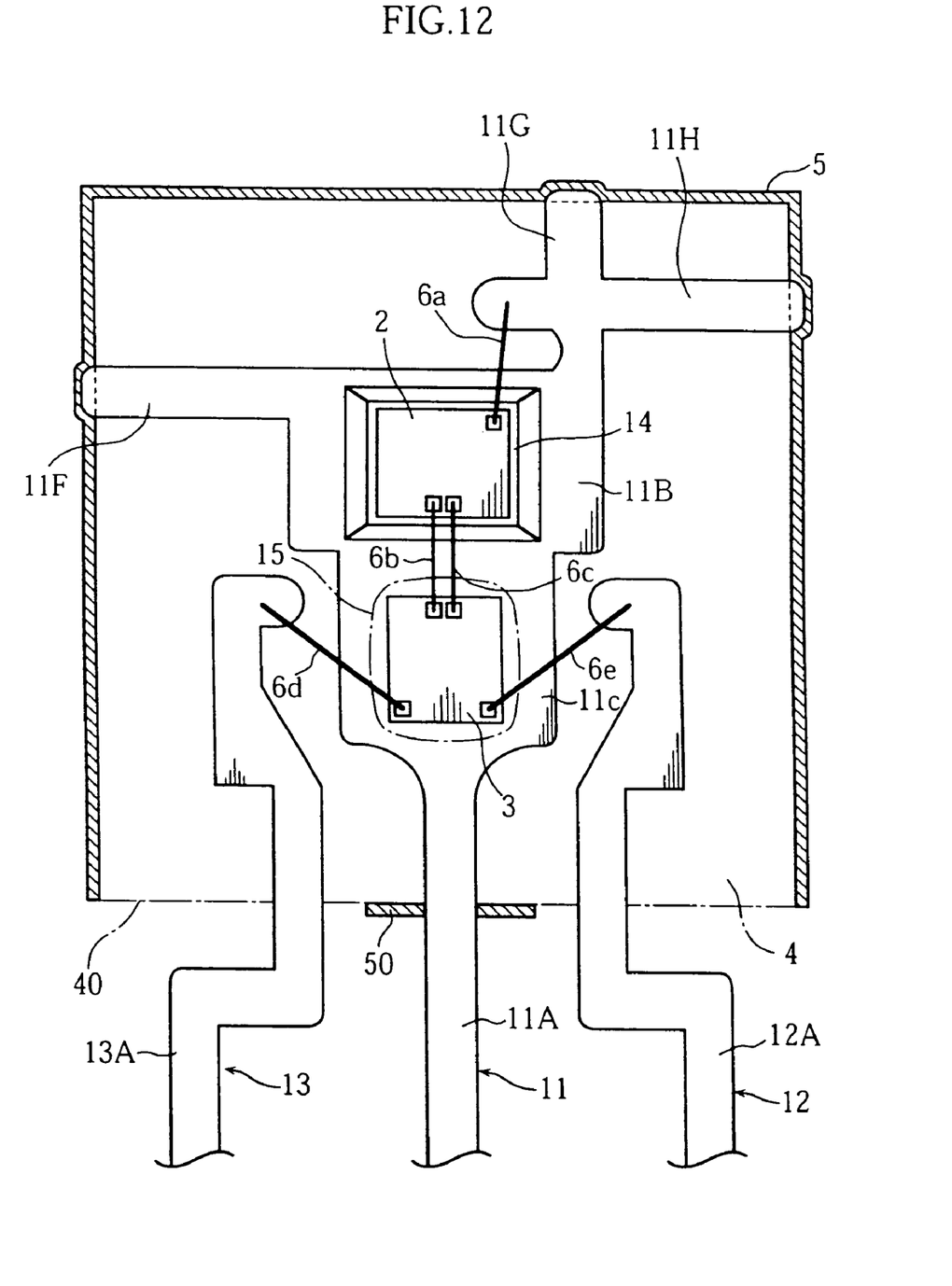
FIG. 12 is a plan view showing a principal portion of a variation of the second embodiment.

FIG. 12 is a plan view showing the principal portion of a variation of the second embodiment. As will be understood from FIG. 12 and FIG. 9 (second embodiment), the structure of this modification differs in following points from that shown in FIG. 9. In this variation, the first lead 11 is provided with a plurality of extensions 11F, 11G and 11H extending from the die bonding portion 11B of the first lead 11. Further, a conductive film 5 is provided on the resin package 4. Similarly to the conductive film (See FIG. 1) of the first embodiment, the conductive film 5 is so provided as to avoid the base end surface 40 and the lens surface (See 42A in FIG. 1) of the resin package 4. Each of the extensions 11F, 11G and 11H has a front end slightly projecting from an obverse surface of the resin package 4 for coming into direct contact with the conductive film 5. Similarly to the first embodiment, the base end surface 40 of the resin package 4 is formed with a connection strip 50 for connecting the conductive film 5 and the grounding terminal 11A to each other.

Except the above-described differences, the light receiving module of the variation shown in FIG. 12 is similar to that of the second embodiment. For example, the photodiode 2 is placed in the recess 14 formed in the die bonding portion 11B of the first lead 11 (See FIG. 10). The recess 14 is defined by a bottom portion to which the photodiode 2 is fixed, and a plurality of flat side walls surrounding the photodiode 2. With such a structure, electromagnetic noise shielding effect can be provided by both of the conductive film 5 and the recess 14 (bottom portion and side walls). The side walls of the recess 14, as a whole, are tapered toward the bottom of the recess 14. Each of the side walls has a reflecting surface for reflecting light toward the photodiode 2. Instead of such a structure, the recess 14 may be defined by a bottom portion to which the photodiode 2 is fixed, and a single sidewall smoothly curved to surround the photodiode 2. The photodiode 2 is connected to the integrated circuit element 3 via two wires 6b and 6c, and the integrated circuit element is covered by a protective member 15 made of resin. The protective member 15 is covered by a resin package 4 and has light shielding property which is higher than that of the resin package 4.

The present invention being thus described, it is apparent that the same may be varied in many ways. Such variations should not be regarded as a departure from the spirit and scope of the present invention, and all such modifications as would be obvious to those skilled in the art are intended to be included within the scope of the following claims.

The invention claimed is:

1. A semiconductor module comprising:
   a resin package including a first surface, and a second surface which is different from the first surface;
   a lead including an inner portion covered by the resin package and an outer portion projecting from the first surface of the resin package;
   a semiconductor element mounted to the inner portion of the lead and covered by the resin package; and
   a conductive film provided separately from the lead for covering at least the second surface of the resin package, the conductive film being provided with a connecting portion held in contact with the outer portion of the lead at the first surface of the resin package;
   wherein the inner portion of the lead includes an extension extending toward the second surface of the resin package, the extension being held in contact with the conductive film at the second surface of the resin package;
   wherein the resin package further includes a third surface extending between the first and second surfaces of the resin package, and a fourth surface opposite to the third surface;
   wherein the inner portion of the lead further includes a second extension extending toward the third surface of the resin package, and a third extension extending toward the fourth surface of the resin package;
   wherein the second extension is held in contact with the conductive film at the third surface of the resin package; and
   wherein the third extension is held in contact with the conductive film at the fourth surface of the resin package.

2. The module according to claim 1, wherein the extension projects from the second surface of the resin package.

3. The module according to claim 1, wherein the semiconductor element comprises a light receiving element having a light receiving surface, the light receiving surface being formed with a mesh-like conductor pattern.

4. The module according to claim 3, wherein the resin package includes a lens surface for converging light onto the light receiving element, and wherein the conductive film has light shielding property.

5. A semiconductor module comprising:
   a resin package including a first surface, and a second surface which is different from the first surface;
   a lead including an inner portion covered by the resin package and an outer portion projecting from the first surface of the resin package;
   a semiconductor element mounted to the inner portion of the lead and covered by the resin package; and
   a conductive film provided separately from the lead for covering at least the second surface of the resin package, the conductive film being provided with a connecting portion held in contact with the outer portion of the lead at the first surface of the resin package;
   wherein the inner portion of the lead includes an extension extending toward the second surface of the resin package, the extension being held in contact with the conductive film at the second surface of the resin package; and wherein the inner portion of the lead is formed with a recess for accommodating the semiconductor element;

wherein the resin package further includes a third surface extending between the first and second surfaces of the resin package and a fourth surface opposite to the third surface;

wherein the inner portion of the lead further includes a second extension extending toward the third surface of the resin package, and a third extension extending toward the fourth surface of the resin package;

wherein the second extension is held in contact with the conductive film at the third surface of the resin package; and wherein the third extension is held in contact with the conductive film at the fourth surface of the resin package.

6. The module according to claim 5, wherein the extension projects from the second surface of the resin package.

7. The module according to claim 5, further comprising a connection strip provided on the first surface of the resin package and connected to the conductive film, the connection strip being held in contact with the lead while surrounding the lead.

8. The module according to claim 5, wherein the recess has a depth which is no smaller than a thickness of the semiconductor element.

9. The module according to claim 5, wherein the recess is defined by a bottom portion to which the semiconductor element is mounted and a side wall surrounding the semiconductor element, the side wall being tapered toward the bottom portion.

10. The module according to claim 9, wherein the side wall of the recess includes a reflective surface for reflecting light toward the semiconductor element.

11. The module according to claim 5, further comprising an integrated circuit element for processing a signal outputted from the semiconductor element, and a resin material covering the integrated circuit element, the resin material being covered by the resin package and having light shielding property which is higher than light shielding property of the resin package.

12. A semiconductor module comprising:

a resin package including a first surface, and a second surface which is different from the first surface;

a lead including an inner portion covered by the resin package and an outer portion projecting from the first surface of the resin package;

a semiconductor element mounted to the inner portion of the lead and covered by the resin package; and a conductive film provided separately from the lead for covering at least the second surface of the resin package, the conductive film being provided with a connecting portion held in contact with the outer portion of the lead at the first surface of the resin package;

wherein the inner portion of the lead includes an extension extending toward the second surface of the resin package, the extension being held in contact with the conductive film at the second surface of the resin package; and wherein the outer portion of the lead includes an upper surface, a lower surface and two opposite side surfaces, the connecting portion of the conductive film being held in contact with the upper, lower and two side surfaces of the outer portion of the lead.

* * * * *